United States Patent [19]

Nakazawa et al.

[11] Patent Number: 5,684,327
[45] Date of Patent: Nov. 4, 1997

[54] LEAD FRAME FOR USE IN A RESIN-SEALED TYPE SEMICONDUCTOR DEVICE

[75] Inventors: Tsutomu Nakazawa; Yumi Inoue, both of Yokohama, Japan

[73] Assignee: Kabushiki Kaisha Toshiba, Kawasaki, Japan

[21] Appl. No.: 527,773

[22] Filed: Sep. 13, 1995

[30] Foreign Application Priority Data

Sep. 15, 1994 [JP] Japan ................... 6-246928

[51] Int. Cl.$^6$ .................... H01L 23/495; H01L 23/28
[52] U.S. Cl. .................... 257/667; 257/669; 257/787; 437/217; 437/219
[58] Field of Search .................... 257/667, 669, 257/787; 437/211, 217, 219

[56] References Cited

U.S. PATENT DOCUMENTS

| | | | |
|---|---|---|---|
| 4,556,896 | 12/1985 | Meddles | 257/667 |
| 4,894,704 | 1/1990 | Endo | 257/667 |
| 5,293,065 | 3/1994 | Chan | 57/667 |
| 5,371,044 | 12/1994 | Yoshida et al. | 257/667 |
| 5,517,056 | 5/1996 | Bigler et al. | 257/667 |

FOREIGN PATENT DOCUMENTS 3-38864  2/1991  Japan .

Primary Examiner—Tom Thomas
Assistant Examiner—David Ostrowski
Attorney, Agent, or Firm—Finnegan, Henderson, Farabow, Garrett & Dunner, L.L.P.

[57] ABSTRACT

A lead frame for use in a resin-sealed type semiconductor device, comprising an outer frame, a plurality of leads supported by the outer frame, arranged side by side and each composed of an inner lead and an outer lead, a die pad arranged inside the outer frame and located so that the tips of the inner leads are close to the die pad and oppose the die pad, and a resin flow-control body. The resin flow-control body has been formed by extending a portion of the outer frame toward the die pad through a space formed in the outer frame. The body is designed to be placed in a cavity of a mold having a gate communicating with the cavity, with the space located between the gate and the cavity, in order to form a resin sealing body.

29 Claims, 12 Drawing Sheets

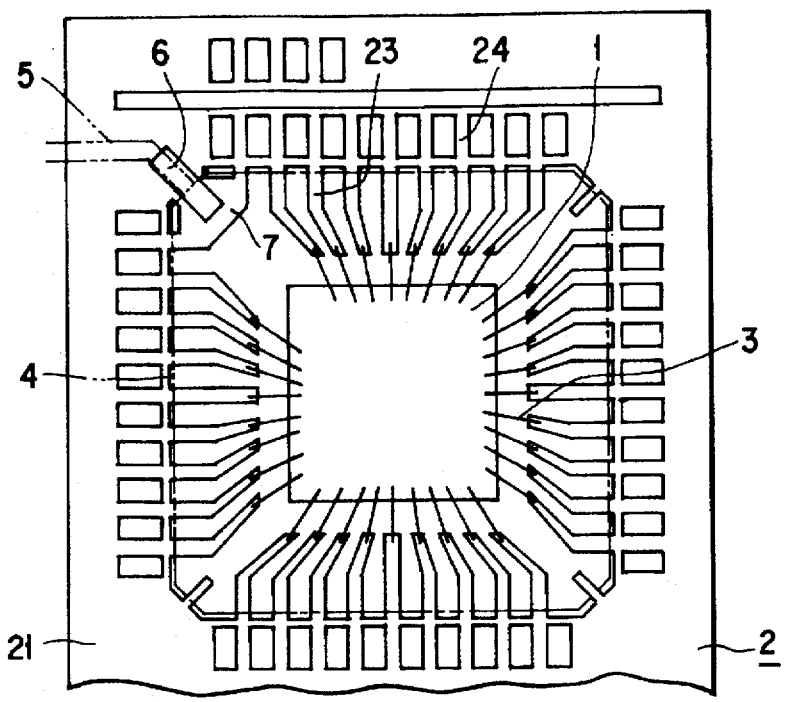
F I G. 20
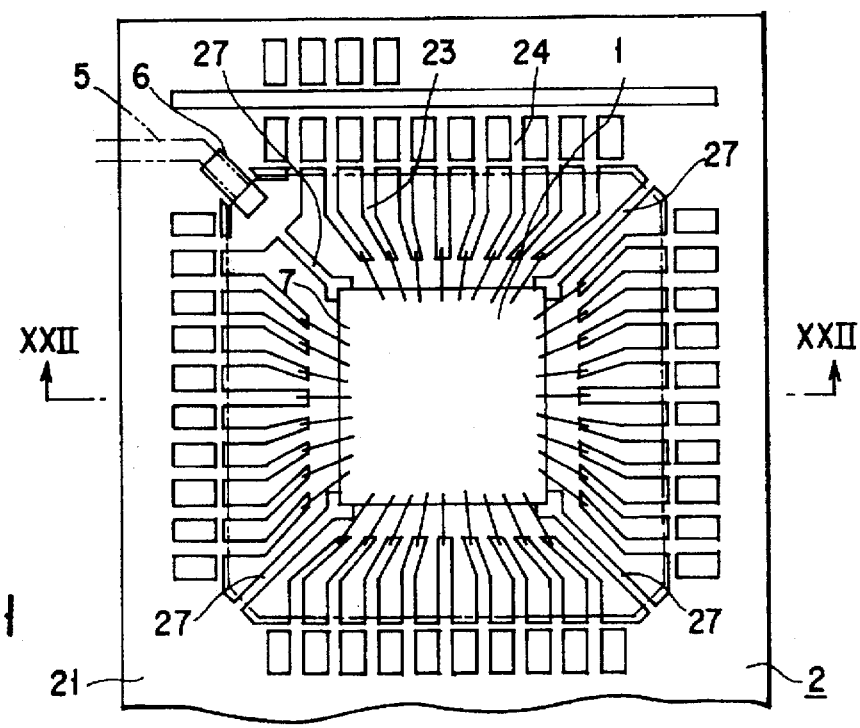
F I G. 21
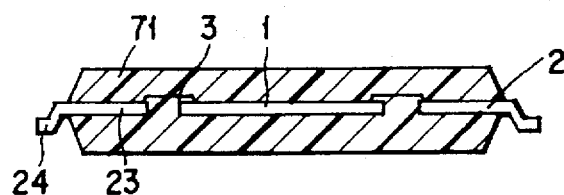
F I G. 22

LEAD FRAME FOR USE IN A RESIN-SEALED TYPE SEMICONDUCTOR DEVICE

BACKGROUND OF THE INVENTION

1. Field of the Invention

The present invention relates to a lead frame of the resin-sealed type semiconductor device and a method of manufacturing a resin-sealed type semiconductor device using this lead frame.

2. Description of the Related Art

Resin-sealed type semiconductor devices such as IC, LSI are formed through a dicing process to independently separate a plurality of semiconductor chips arranged on the wafer, a die-bonding process to mount the separated independent semiconductor chip to the lead frame, a wire-bonding process to connect the electrode pad on the semiconductor chip and the inner leads of the lead frame by using wires such as Au wire and Al wire, and a packaging process to seal with resin the semiconductor chip and wires and inner leads accompanied therewith.

In order to resin-seal the semiconductor chip, the transfer molding method is generally used.

The resin-sealing process of the resin-sealed type semiconductor device produced by the conventional transfer molding (injection molding) will be described with reference to FIG. 1A to FIG. 1E.

As shown in FIG. 1A, mount a semiconductor device 1 to the die pad (not shown) of the lead frame 2, and connect the semiconductor chip 1 and the lead frame 2 by a bonding wire 3.

Set the lead frame 2, to which this semiconductor chip 1 is mounted, to the cavity 4 of the mold die 9, and press it with the upper and lower molds 91 and 92. Next, as shown in FIG. 1B, pre-heat the resin tablet 70 such as epoxy resin and the like in advance by the high frequency preheater, and supply this resin tablet 70 to the pot 20 of the mold 91.

Then, as shown in FIG. 1C, push out the resin tablet 70 by the plunger 40 to flow out the resin to be inserted into the cavity 4. After the resin inserted into the cavity 4 has cured to some extent, as shown in FIG. 1D, release the upper and the lower molds 91 and 92 and remove the excess portions adhered to the molded article, such as culls 80 and runners 90, to obtain molded articles of the semiconductor chip covered with a resin sealing body 71, as shown in FIG. 1E.

The state of the lead frame at the time of conventional resin sealing will be described with reference to FIG. 2 and FIG. 3.

FIG. 2 is a plan view of the lead frame 2 mounted to the mold, FIG. 3 is a sectional view of the lead frame arranged in the cavity of the mold, along the line III—III shown in FIG. 2.

As is obvious from those figures, the leads are guided out from two directions on the longer sides of the resin sealing body.

The lead frame 2 is formed by etching and diecutting of a material such as a sheet material or a coil material, being etched according to the resist pattern formed on the material and subjected to the surface treatment with Au plating or Ag plating to be completed. Similarly, in the die-cutting method, the material can be patterned to the shape of the lead frame by the press mold. The material is composed of Fe-42Ni alloy or Cu alloy.

The lead frame 2 is composed of an outer frame 21, a die pad 22 having a semiconductor chip 1 mounted thereto, inner leads 23 sealed with a resin sealing body and outer leads 24 guided out from the resin sealing body, which are used as one unit, and by repeating a plurality of units, they are formed in a film-like shape.

The semiconductor chip 1 is adhered to the die pad 22, and the pad electrode (not shown) of the semiconductor chip 1 and inner leads 23 are connected by bonding wires 3. In the state that the lead frame 2 is set to the mold 9 for resin sealing, the inner leads 23 of the lead frame 2, the die pad 22 and hanger pins 25 which support the die pad are housed in the cavity 4 (the region shown by a virtual line in FIG. 2) composed of concave portions of the upper mold 91 and the lower mold 92.

Into this cavity 4, the resin which becomes the resin sealing body is filled.

When resin sealing is conducted by a transfer mold, the resin is, as shown in FIG. 3, flown in toward the cavity 4 formed by the upper mold 91 and the lower mold 92 which hold the lead frame 2, but the entrance of the cavity 4 is narrowed by a projecting body 5a which projects from a part of the lower mold 92. Therefore, the quantity of the resin flown in from the gate 5 is restricted.

In the present circumstances, in the resin-sealed package of the semiconductor device, the semiconductor chip becomes large and has higher integration density, while the size of the package remains almost unchanged. Therefore, the ratio in size of the semiconductor chip 1 to the package becomes larger and larger. Particularly, it is quite difficult to seal the resin uniformly in the semiconductor device using a thin-type package.

The gate 5 is generally provided between the opposite inner surfaces of the upper mold 91 and the lower mold 92, and communicates with the cavity 4. In this case, the resin to be injected in flows such that the resin meets the gate 5 and abuts against one face of the lead frame 2 in front of the projecting body 5a. Therefore, in the cavity, a shade of the flow is generated on the upper face side of the lead frame 2, and a void is caused in this shade after resin sealing.

This void becomes the cause of the water invasion and deteriorates the moisture resistance of the semiconductor device, which is the problem of the conventional lead frame.

Next, the conventional preparation process to uniformly form the resin sealing body will be described with reference to FIG. 4 and FIG. 5.

FIG. 4 is a plan view of the lead frame held by the mold, and FIG. 5 is a sectional view of the mold 9 and lead frame 2 arranged in the cavity of the mold 9. A notch 26 is formed in the outer frame 21 of the lead frame 2. This notch 26 is located facing the gate 5 of the mold 9.

This shows the embodiment in which the leads are guided from two directions of the longer side faces of the resin sealing body. By forming this notch 26, the hanger pin 25 connected to the die pad 22 from the lead 2 on the side where this notch 26 is provided is omitted.

The embodiment shown in FIG. 4 and FIG. 5 are the same as the embodiment shown in FIG. 2 and FIG. 3 except that a notch 26 is provided and a part of the hanger pin is omitted. Accordingly the description for the similar part will be omitted.

As the thickness of the package becomes thin, the thickness (T) between the tip of the projection of said projecting body 5a immediately before entering to the cavity 4 of the gate 5 and said mold 91 opposite to this tip cannot be made large. Therefore, in this conventional embodiment, by providing a notch 26 in the outer frame 21 of the lead frame 2, the thickness of the gate is secured.

Said thickness T is currently 250 µm, but if the thickness of the package becomes as thin as 350 µm, the thickness T cannot be expected to be 150 µm or so, whereby it is necessary to increase the thickness T by providing such notch 26.

Therefore, according to this conventional embodiment, it is known that the resin supplied into the cavity 4 from the gate 5 contacts both faces of the leads of the lead frame 2. The resin flows uniformly into the cavity 4, reducing the occurrence of said void.

Next, the structure of the lead frame 2 with respect to the conventional square package will be described with reference to FIG. 6.

In this lead frame, the outer leads 24 are guided from the four sides of the resin sealing body, to which a square semiconductor chip 1 is mounted. In the square package, the resin is injected from one corner among four corners of the lead frame 2.

The structure of the lead frame shown in FIG. 6 is basically the same with the structure shown in FIG. 2, except that the outer leads are guided from four directions of the resin sealing body, while in the lead frame shown in FIG. 2, the outer leads are guided from two directions, and the same reference numeral is given to the same part and the description of the structure will be omitted.

The semiconductor chip is adhered to the die pad 22, and the pad electrode of the semiconductor chip and the inner leads 23 are connected by bonding wires (not shown).

In the state that the lead frame 2 is set to the mold 9 for resin sealing, the inner leads 23 of the lead frame 2, the die pad 22 and hanger pins 25 which support the die pad are included in the cavity 4 (the region shown by a virtual line) composed of concave portions of the upper mold 91 and the lower mold 92. Into this cavity 4, the resin which becomes the resin sealing body is filled, and they are all resin-sealed.

As is obvious from FIG. 4 and FIG. 6, the injection port which injects the fluidized resin into the cavity 4 from the gate 5 may be formed on one edge of the cavity 4, or formed at a corner portion thereof.

FIG. 7A and FIG. 7B are schematic plan views of the mold, and the resin injected from the pot 20 are injected from the gate 5 through the cull 80, via the runner 90 to the cavity 4 of the mold.

And in the case where the cavity 4 is square, that is, the resin sealing body formed here is square, as shown in FIG. 7A, the injection port of the resin from the gate 5 to the cavity 4 is formed at one corner portion. In the case where the cavity 4 is rectangular, that is, the resin sealing body formed here is rectangular, as shown in FIG. 7B, the injection port of the resin from the gate 5 to the cavity 4 is formed at a roughly central position of the short edge of the cavity 4.

Next, the flow of the resin at the time of molding by the conventional transfer molding method will be described with reference to FIG. 8 which is the sectional view of the main part of the mold for forming the resin sealing.

FIG. 8 is a sectional view of the main part of the mold for forming the resin sealing.

The resin tablet supplied by the pot 20 is fluidized, and flown into the gate 5 through the cull (not shown) by the drop of the plunger 40, from the cull through the runner 90, and injected into the cavity 4 from the gate 5.

In injecting the resin from the gate 5 to the cavity 4, the die pad 21 of the lead frame 2 having a semiconductor chip 2 mounted thereto inclines, or rises or falls by losing the upper and lower balance, due to the quantity of the resin at the time of injection and the flow rate thereof.

Particularly for a thin-type package, even a slight inclination causes the die pad or the chip to be exposed outside of the package.

As described in the conventional embodiments of FIG. 4 and FIG. 5, the resin flown into the cavity 4 by the presence of the notch 26 provided on the outer frame 21 of the lead frame flows relatively uniformly, but there is a fear that the flow of the resin still changes delicately even by a slight change of the position within the cavity 4 of the lead frame 2, thereby the resin does not flow uniformly to the upper and lower portions of the cavity 4.

SUMMARY OF THE INVENTION

The object of this invention is to eliminate the above-mentioned defects and to provide a lead frame of the resin-sealed type semiconductor device having a structure to suppress the inclination, rise and fall of the semiconductor chip located inside in the thin-type resin sealing package and a method of manufacturing a resin-sealed type semiconductor device.

To attain the objects, there is provided a lead frame for use in a resin-sealed type semiconductor device, comprising: an outer frame; a plurality of leads supported by the outer frame, arranged side by side and each composed of an inner lead and an outer lead; a die pad arranged inside the outer frame and located so that the tips of the inner leads are close to the die pad and oppose the die pad; and a resin flow-control body formed by extending a portion of the outer frame toward the die pad through a space formed in the outer frame, and designed to be placed in a cavity of a mold having a gate communicating with the cavity, with the space located between the gate and the cavity, in order to form a resin sealing body.

According to the invention, there is provided another lead frame for use in a resin-sealed type semiconductor device, comprising; an outer frame; a plurality of leads supported by the outer frame, arranged side by side and each composed of an inner lead and an outer lead; and a resin flow-control body formed by extending a corner of the outer frame toward a corner of a substantially square semiconductor chip, and designed to be placed in a cavity of a mold having a gate communicating with the cavity, with the space located between the gate and the cavity, in order to form a resin sealing body.

Further, according to the present invention, there is provided a method of manufacturing a resin-sealed type semiconductor device, comprising the steps of: forming providing a lead frame comprising an outer frame, a plurality of leads supported by the outer frame, arranged side by side and each composed of an inner lead and an outer lead, and a die pad arranged inside the outer frame and located so that the tips of the inner leads are close to the die pad and oppose the die pad; forming a resin-flow body by extending a portion of the outer frame toward the die pad through a space provided in the outer frame; mounting a semiconductor chip on the die pad; preparing a mold comprising an upper half and a lower half and having a cavity; placing the resin flow-control body in the cavity of the mold; positioning the space between the gate and the cavity; and introducing molten resin into the cavity of the mold through the gate, thereby forming a resin body sealing the semiconductor chip.

Still further, according to the invention, there is provided a method of manufacturing a resin-sealed type semiconductor device, comprising the steps of: forming providing a lead frame comprising an outer frame, a plurality of leads supported by the outer frame, arranged side by side and each composed of an inner lead and an outer lead; locating a semiconductor chip such that tips of the inner leads opposing the semiconductor chip; forming a resin-flow body by extending a portion of the outer frame toward the semiconductor chip through a space provided in the outer frame; preparing a mold comprising an upper half and a lower half and having a cavity; placing the resin flow-control body in the cavity of the mold; positioning the space between the gate and the cavity; and introducing molten resin into the cavity of the mold through the gate, thereby forming a resin body sealing the semiconductor chip.

By the structure described above, the lead frame of the resin-sealed type semiconductor device and the method of manufacturing the resin-sealed type semiconductor device of the present invention can obtain such effects that the injection of the resin from the gate to the cavity is made stable, thereby to prevent the semiconductor chip from losing the balance and inclining or rising or falling.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 20 is a plan view showing still another lead frame of the present invention, which has no die pads;

FIG. 21 is a plan view showing another lead frame of the present invention, which has no die pads;

FIG. 22 is a sectional view of the resin-sealed type semiconductor device of the present invention, taken along the line XXII—XXII in FIG. 21;

DETAILED DESCRIPTION OF THE PREFERRED EMBODIMENTS

Embodiments of the present invention will now be described with reference to the accompanying drawings.

First, the first embodiment will be described with reference to FIG. 9 and FIG. 11.

Figure 9:
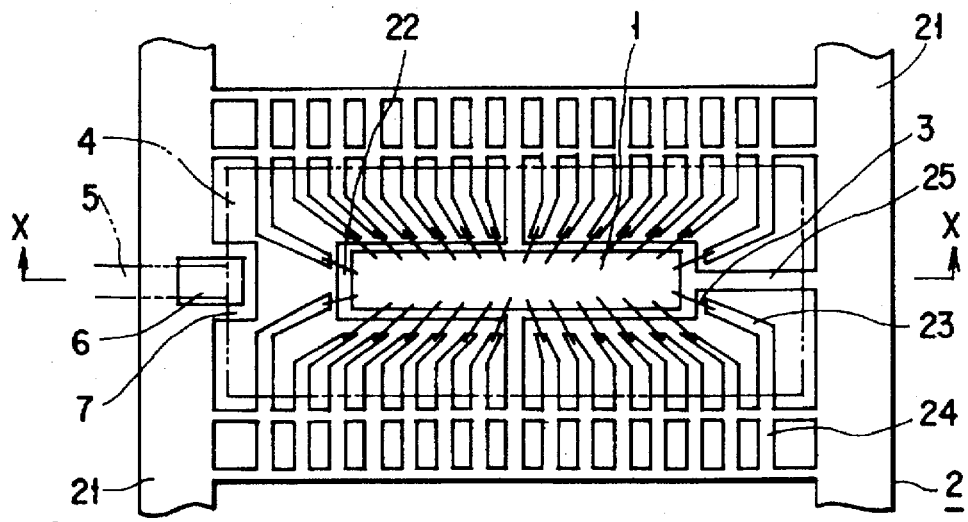
FIG. 9 is a plan view showing one embodiment of the lead frame of a resin-sealed type semiconductor device according to the present invention.
Figure 10:
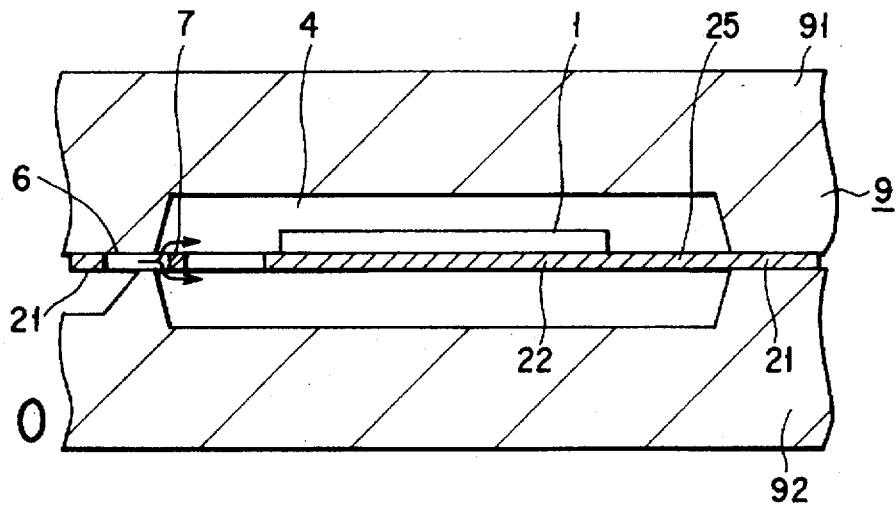
FIG. 10 is a sectional view taken along the line X—X in FIG. 9, showing the lead frame mounted on the gate of said mold and provided in the cavity.

FIG. 9 is a plan view showing one embodiment of the lead frame of the resin-sealed type semiconductor device of the present invention. FIG. 10 is a sectional view along the line X—X in FIG. 9 of the lead frame in the state mounted to the gate of said mold and into the cavity.

The lead frame 2 is molded by etching or diecutting of a material such as a sheet material or a coil material. For example, the lead frame 2 is etched according to the resist pattern formed on the material and subjected to the surface treatment with Au plating and Ag plating to be completed.

Also, in the die-cutting method, the material is patterned to the shape of the lead frame by the press mold.

The material is composed of Fe-42Ni alloy or Cu alloy. The lead frame 2 is composed of an outer frame 21, a die pad 22 having a semiconductor chip 1 mounted thereto, and leads comprising inner leads 23 sealed with a resin sealing body and outer leads 24 guided out from the resin sealing body, which are used as one unit, and adjoined sequentially and molded repeatedly to be formed in a film-like shape.

The semiconductor chip 1 is adhered to the die pad 22, and the pad electrode (not shown) of the semiconductor chip 1 and inner leads 23 are connected by bonding wires 3. Leads are guided out to two directions from sides in the longitudinal direction with respect to the rectangular semiconductor chip 1.

As shown in FIG. 10, in the state that the lead frame 2 is set to the mold 9 for resin sealing, the inner leads 23 of the lead frame 2, the die pad 22 and hanger pins 25 which support the die pad 22 are housed in the cavity 4, which is the region shown by a dotted line in FIG. 9, composed of concave portions of the upper mold 91 and the lower mold 92.

Into this cavity 4, the resin which becomes the resin sealing body is filled. The entrance of the gate 5 which injects the resin to the cavity 4, which is provided in the upper mold 91 and the lower mold 92, is formed in the center of one short side of the rectangular cavity 4. This is arranged along the line of X—X of FIG. 9.

That portion of the outer frame 21 which is set in the gate 5 extends toward the die pad through a space formed in said outer frame 21, reaching the vicinity of the boundary between the gate 5 and the cavity 4. This extended portion is referred to as a resin flow-control body 7. The width of said space 6 is formed to be larger than the width of the gate 5.

The resin is injected through the gate 5, through the space 6 provided in the outer frame 21 and guided by the resin flow-control body 7 into the cavity 4, in the direction of an arrow in FIG. 10.

The resin-flow control body 7 defines the space 6. That side of the body 7 onto which the resin flowing trough the gate 5 is applied and the adjacent two sides of the body 7 which oppose each other form two corners. These corners have an angle of about 90° C. The body 7 including part of the space 6 is substantially rectangular as seen from above the surface of the read frame.

The resin-flow control body 7 is located at a midpoint between the top and bottom of the cavity 4. Therefore, the molten resin injected from the gate 5 in a great amount flows through the space 6, is divided at the side of the body 7 into an upper stream and a lower stream which are equal in volume.

This space 6 and the resin flow-control body 7 moderate the flow of the resin flown into the cavity from the gate and stabilize the resin flow in the gate portion.

Next, the second embodiment of the lead frame of the present invention will be described with reference to FIG. 11 and FIG. 12.

Figure 11:
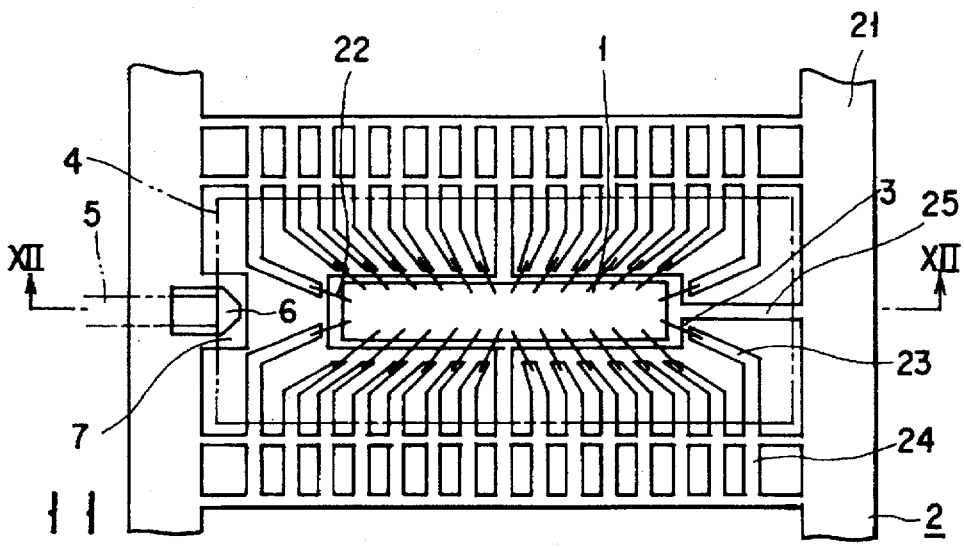
FIG. 11 is a plan view showing another embodiment of the lead frame of the resin-sealed type semiconductor device according to the present invention.
Figure 12:
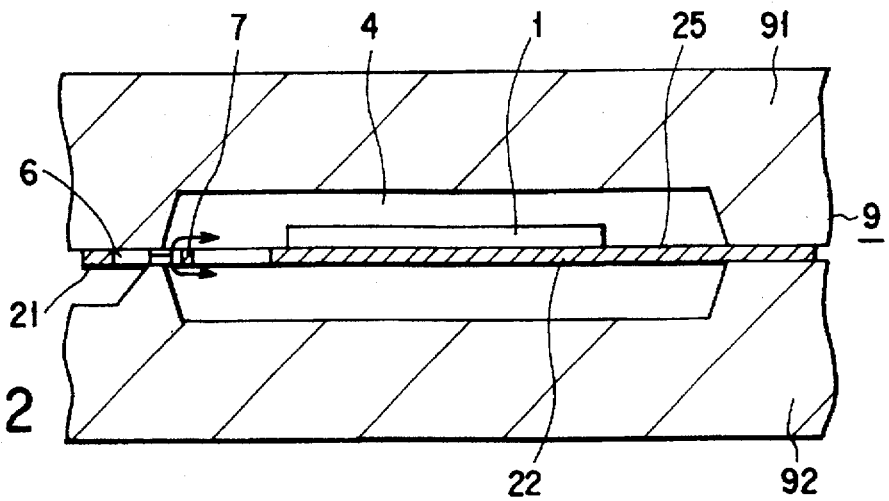
FIG. 12 is a sectional view taken along the line XII—XII in FIG. 11, showing the lead frame mounted on the gate of said mold and provided in the cavity.

FIG. 11 is a plan view showing the lead frame mounted to the mold for forming the resin sealing body of the present invention. FIG. 12 is a sectional view along the line XII—XII shown in FIG. 11 of the lead frame in the state mounted to the gate of said mold and into the cavity.

The molding method, the material and the main structure of the lead frame 2 are the same as in the embodiment shown in FIG. 9 and FIG. 10, therefore the description thereof will be omitted.

The resin flow-control body 7 in this embodiment is in a shape that two corners are chamfered so that the flowing resin is applied thereto vertically, and the plane on the lead frame including said space is rectangular.

The resin flow-control body 7 is located at the midpoint between the top and bottom of the cavity 4. Hence, the molten resin injected from the gate 5 in a great amount flows through the space 6, is divided at the side of the body 7 into an upper stream and a lower stream which are equal in volume. The resin can be divided smoothly since the two corners of the body 7 is chamfered.

The structure of both the space 6 and the resin flow-control body 7 makes the resin flow stable at the injecting port of the resin of the gate 5.

Furthermore, the resin flow-control body 7 can be made a strong structure by being integrated with the outer frame 21 of the lead frame 2 through the space 6 and extended, whereby the influence of the resin injected into the semiconductor chip 1 can be made moderately and inclination of the flow can be suppressed.

Moreover, the resin flows uniformly in the vertical direction, whereby the rise and fall of the chip can be suppressed.

Next, the third embodiment of the lead frame of the present invention will be described with reference to FIG. 13 and FIG. 14.

Figure 13:
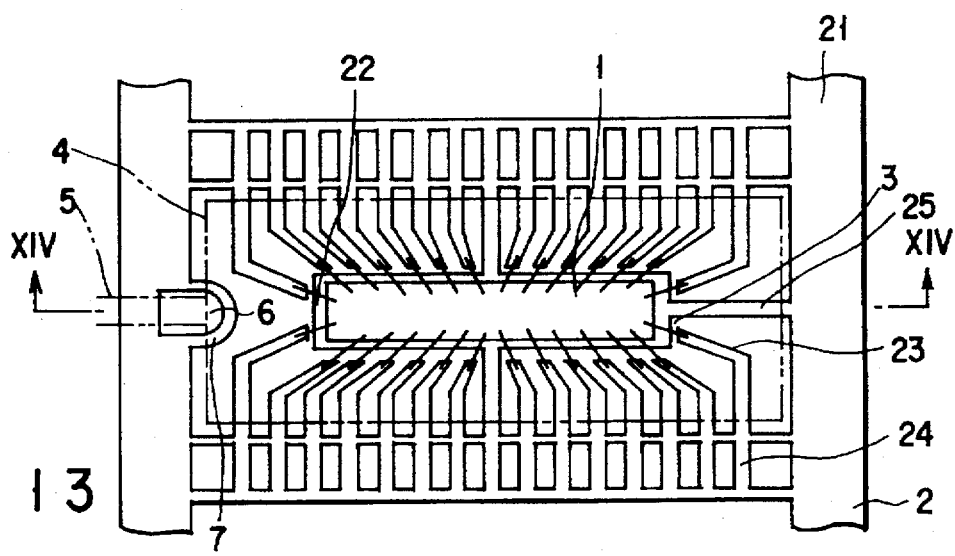
FIG. 13 is a plan view showing still another embodiment of the lead frame of the resin-sealed type semiconductor device according to the present invention.
Figure 14:
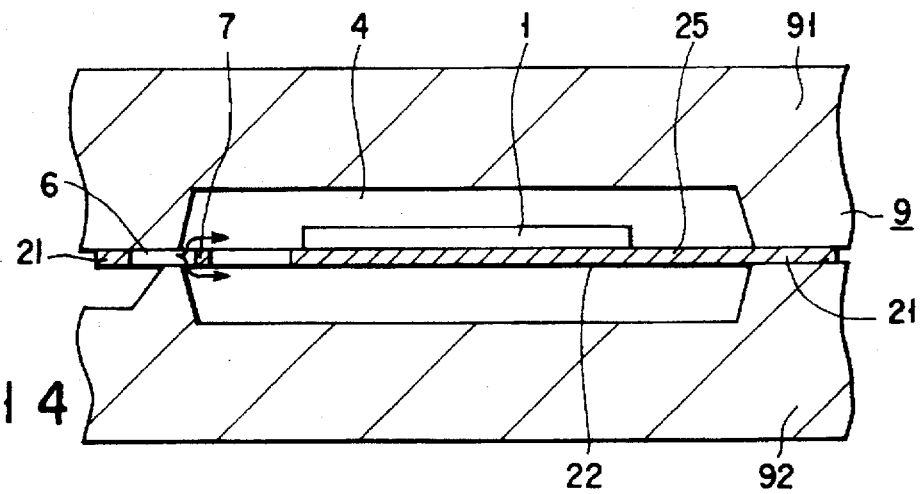
FIG. 14 is a sectional view taken along the line XIV—XIV in FIG. 13, showing the lead frame mounted on the gate of said mold and provided in the cavity.

FIG. 13 is a plan view showing other embodiment of the lead frame mounted to the mold for forming the resin sealing body of the present invention. FIG. 14 is a sectional view along the line XIV—XIV shown in FIG. 13 of the lead frame in the state mounted to the gate of said mold and into the cavity.

The molding method, the material and the main structure of the lead frame 2 are the same as in the embodiment shown in FIG. 9 and FIG. 10, therefore the description thereof will be omitted.

That side of the resin flow-control body 7 onto which the resin is applied is arcuate. The body 7 including part of the space 6 is substantially semicircular as seen from above the surface of the read frame. Hence, the resin flows perpendicular to this side of the body 7.

This third embodiment can obtain the similar effect as in the second embodiment shown in FIG. 11 described above.

Next, the fourth embodiment of the lead frame of the present invention will be described with reference to FIG. 15 and FIG. 16.

Figure 15:
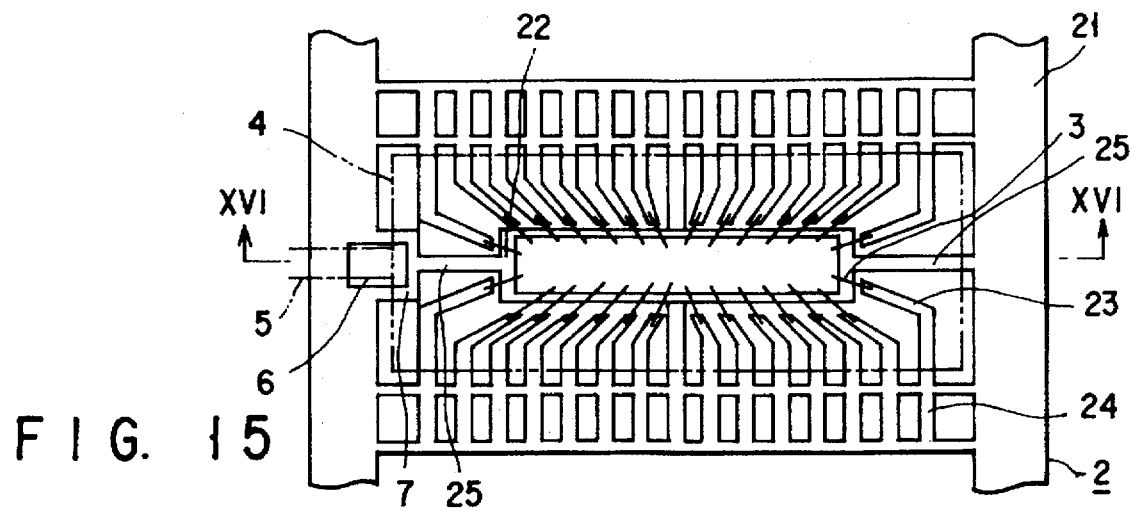
FIG. 15 is a plan view showing another embodiment of the lead frame of the resin-sealed type semiconductor device according to the present invention.
Figure 16:
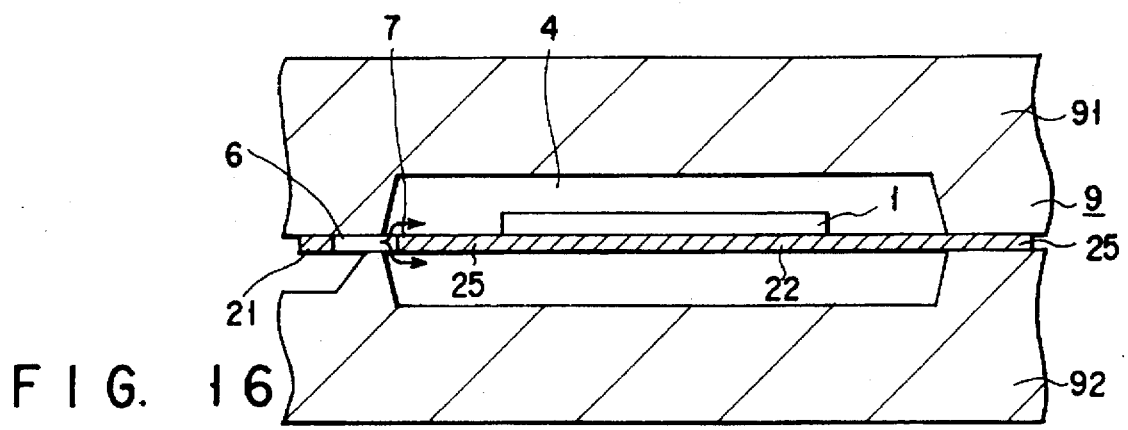
FIG. 16 is a sectional view taken along the line XVI—XVI in FIG. 15, showing the lead frame mounted on the gate of said mold and provided in the cavity.

FIG. 15 is a plan view showing other embodiment of the lead frame mounted to the mold for forming the resin sealing body of the present invention. FIG. 16 is a sectional view along the line XVI—XVI shown in FIG. 15 of the lead frame in the state mounted to the gate of said mold and into the cavity.

The molding method, the material and the main structure of the lead frame 2 are the same as in the embodiment shown in FIG. 9 and FIG. 10, therefore the description thereof will be omitted.

In the fourth embodiment shown in FIG. 15, the resin flow-control body 7 and the opposing die pad 22 are coupled by hanger pins 25 to increase the mechanical strength.

Other technical effects are the same with the effect obtained in the first embodiment shown described above.

Next, the fifth embodiment of the lead frame of the present invention will be described with reference to FIG. 17.

Figure 17:
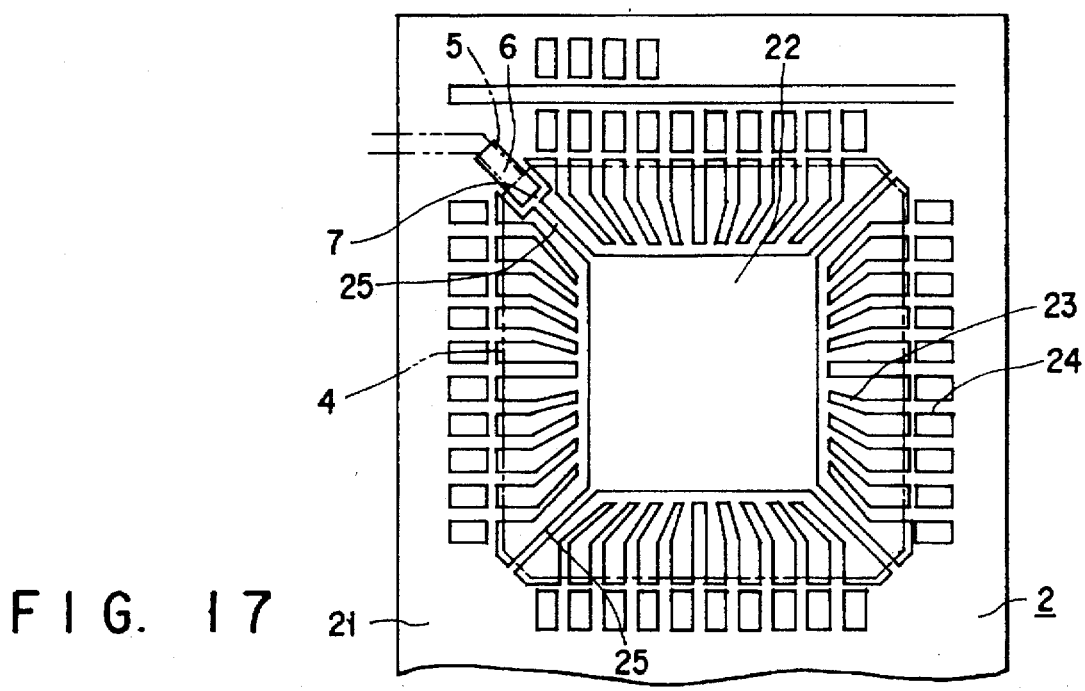
FIG. 17 is a plan view showing another lead frame of the present invention, for use in the resin-sealed type semiconductor device having roughly square semiconductor chips in which leads are guided from four sides of the chip.

FIG. 17 is a plan view showing other embodiment of the present invention which is applied to the resinsealed type semiconductor device having square semiconductor chips in which leads are guided from four sides of the chip.

The first to the fourth embodiments described above relate to the resin-sealed type semiconductor devices, each having a rectangular semiconductor chip in which leads are guided from two sides of the chip, but this fifth embodiment is a resin-sealed type semiconductor device having a square semiconductor chips in which leads are guided from the four sides of the chip.

Figure 1A:
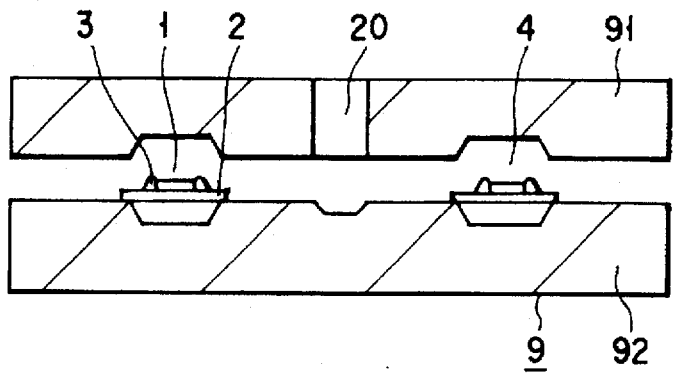
FIG. 1A is a sectional view of a conventional resin-sealed type semiconductor device, explaining the resin sealing step.
Figure 1B:
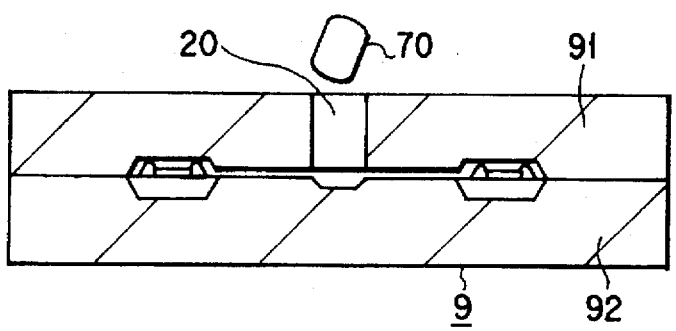
FIG. 1B is a sectional view of the resin-sealed type semiconductor device, explaining the step following the step shown in FIG. 1A.
Figure 1C:
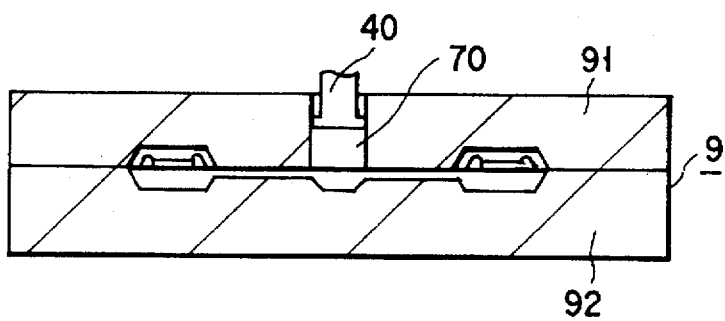
FIG. 1C is a step diagram of the section of the resin-sealed type semiconductor device, following to FIG. 1B.
Figure 1D:
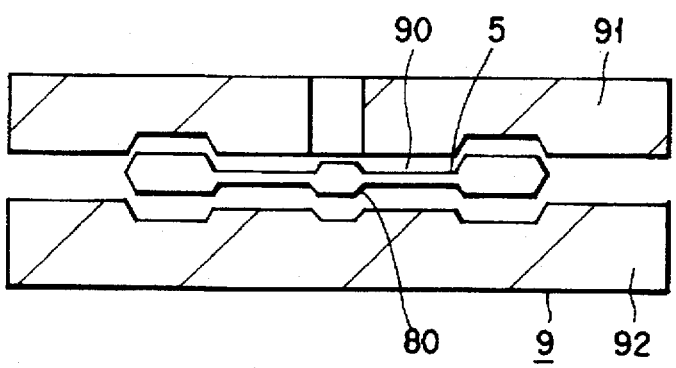
FIG. 1D is a step diagram of the section of the resin-sealed type semiconductor device, following to FIG. 1C.
Figure 1E:
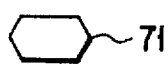
FIG. 1E is a view showing the semiconductor device molded by resin sealing.
Figure 1E:
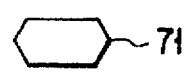
Figure 2:
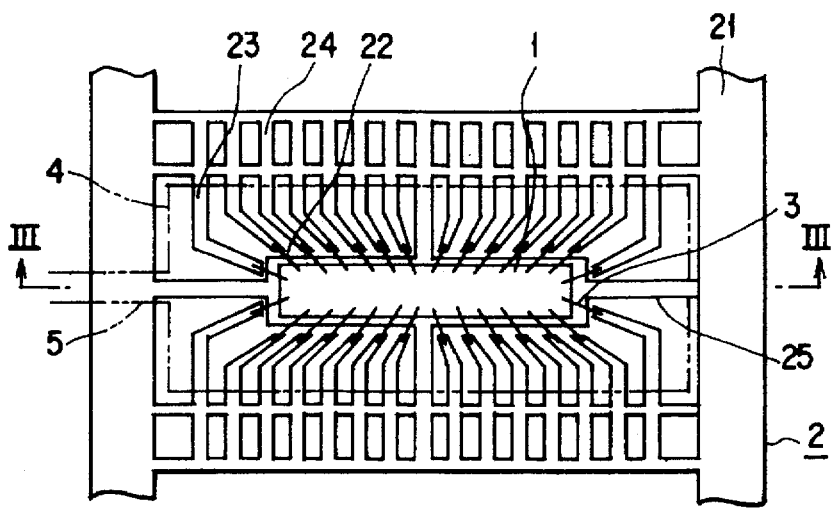
FIG. 2 is a plan view of a conventional lead frame mounted on the mold.
Figure 3:
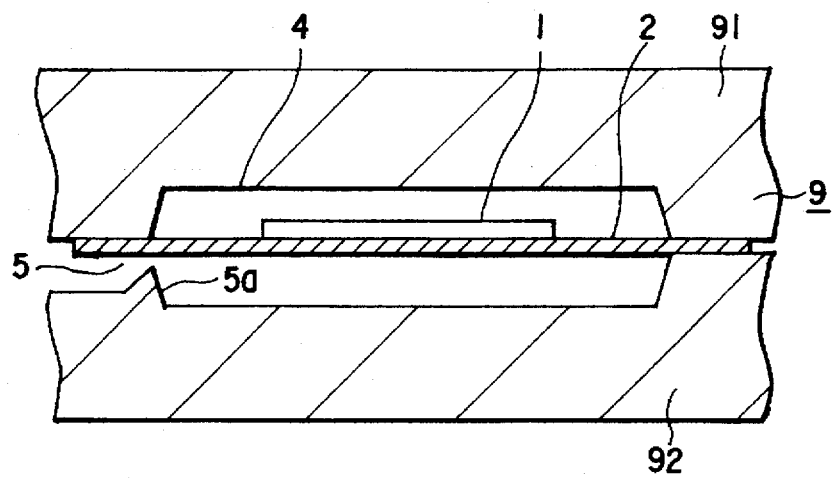
FIG. 3 is a sectional view taken along the line III—III in FIG. 2, showing the lead frame mounted on the gate of said mold into the cavity.
Figure 4:
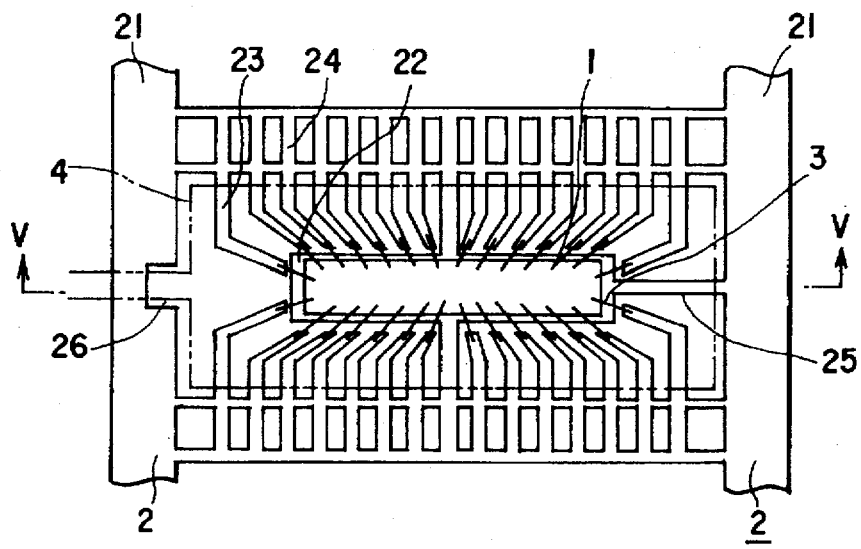
FIG. 4 is a plan view of another conventional lead frame mounted on the mold for forming the resin sealing body.
Figure 5:
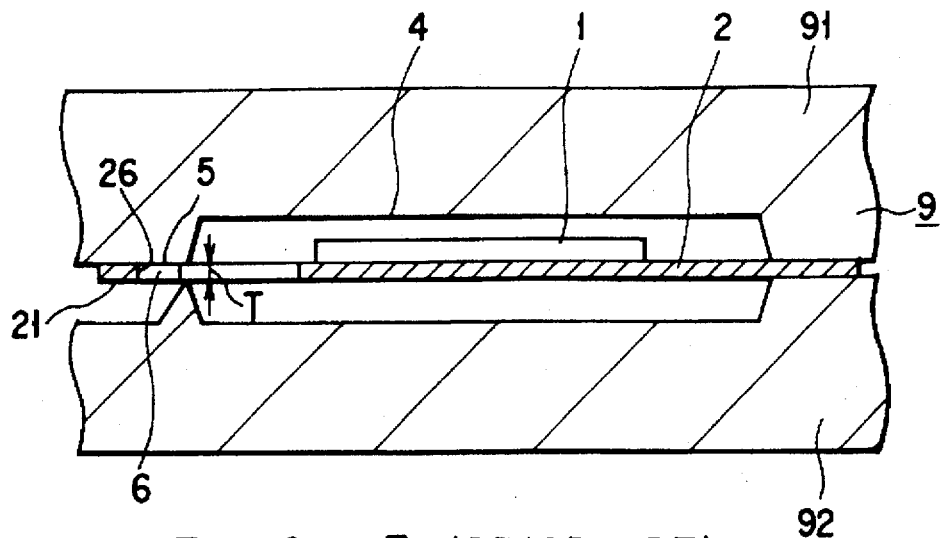
FIG. 5 is a sectional view taken along the line V—V in FIG. 4, showing the lead frame mounted on the gate of said mold and provided in the cavity.
Figure 6:
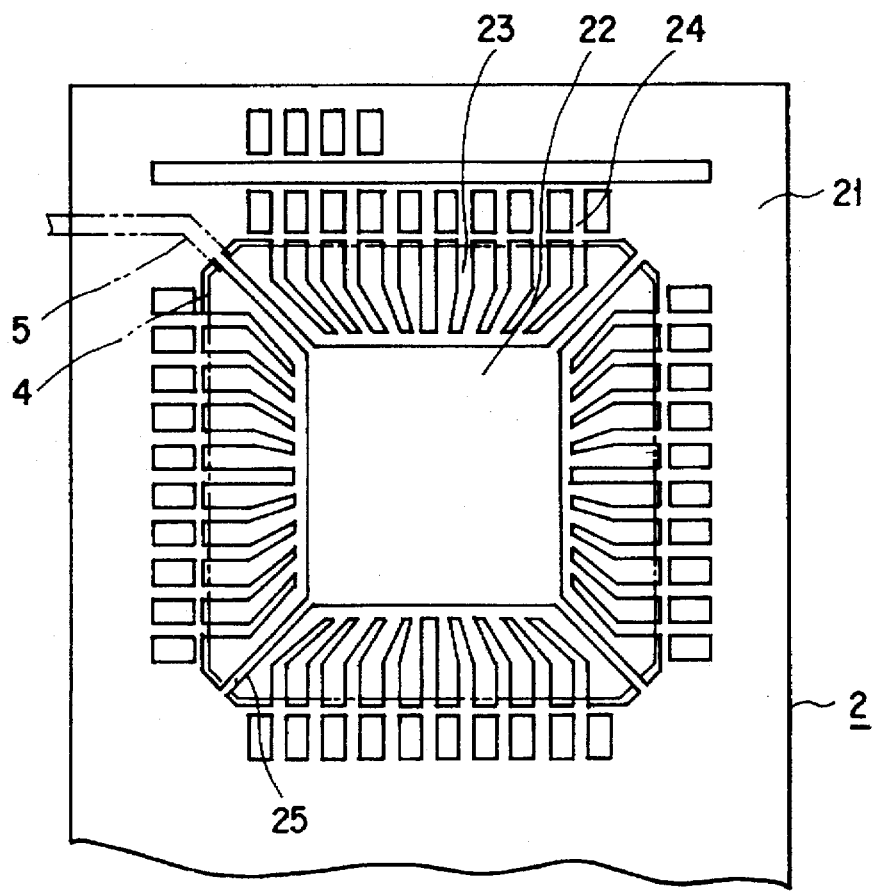
FIG. 6 is a plan view showing the lead frame of a conventional square package.
Figure 7A:
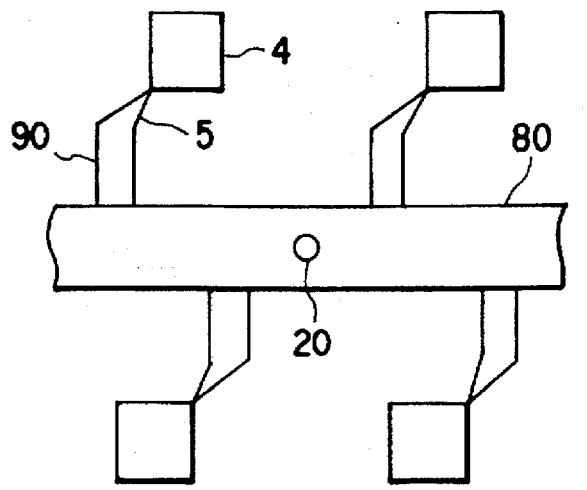
FIG. 7A is a schematic view showing a conventional flow channel for applying resin into the cavity of a mold.
Figure 7B:
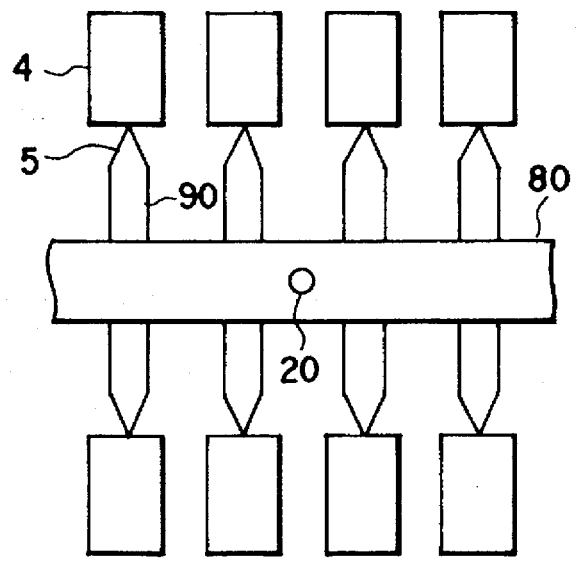
FIG. 7B is a schematic view showing another conventional flow channel for applying resin into the cavity of a mold.
Figure 8:
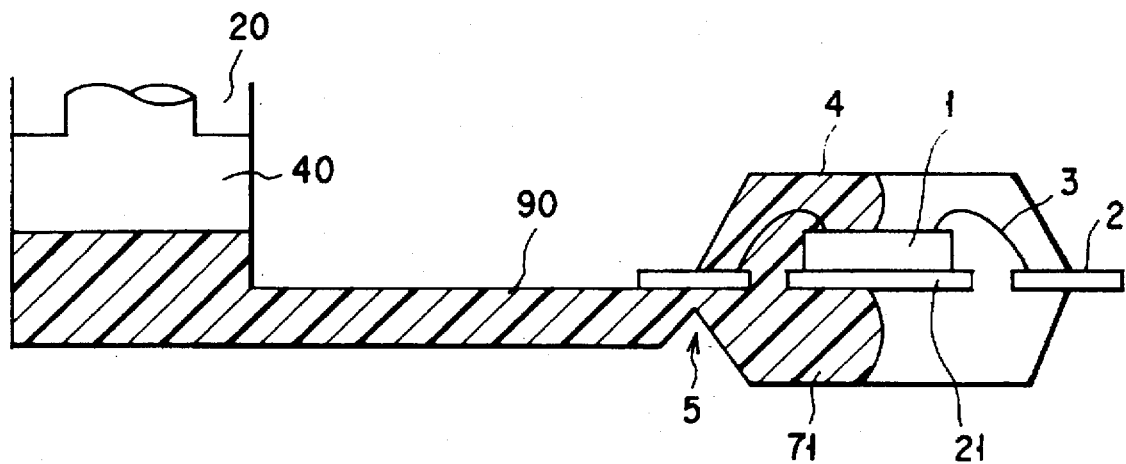
FIG. 8 is a sectional view of the main part of the mold for forming the resin sealing body, illustrating the flow of the resin at the time of molding in the conventional transfer molding method.

In such resin-sealed type semiconductor devices, when the lead frame 2 is arranged to the cavity 4 of said mold, the resin is injected from the gate 5 of one corner of the cavity 4, as shown in FIG. 7A.

In FIG. 17, only the lead frame 2 mounted to said mold is shown, and the semiconductor chip mounted thereto is not shown.

The space 6 and the resin flow-control body 7 cooperate to stabilize the resin flow in the gate portion as described above. Since the resin flow-control body 7 is coupled integrally with the outer frame 21 of the lead frame 2 through this space 6, the resin flow-control body 7 is formed more stronger, and when the resin is injected into the cavity 4, the influence due to the resin flow becomes moderate, whereby the inclination of the die pad due to the flow can be suppressed, and rise and fall of the semiconductor chip mounted on this die pad can be suppressed.

The resin flow-control body 7 and the opposing die pad 22 are coupled by hanger pins 25. Therefore, the mechanical strength of the frame per se is increased. The hanger pins 25 are also formed in other three corners.

The molding method and the material of the lead frame 2 are the same as in the embodiment shown in FIG. 1 to FIG. 4, therefore the description thereof will be omitted.

Next, the sixth embodiment of the lead frame of the present invention will be described with reference to FIG. 18.

Figure 18:
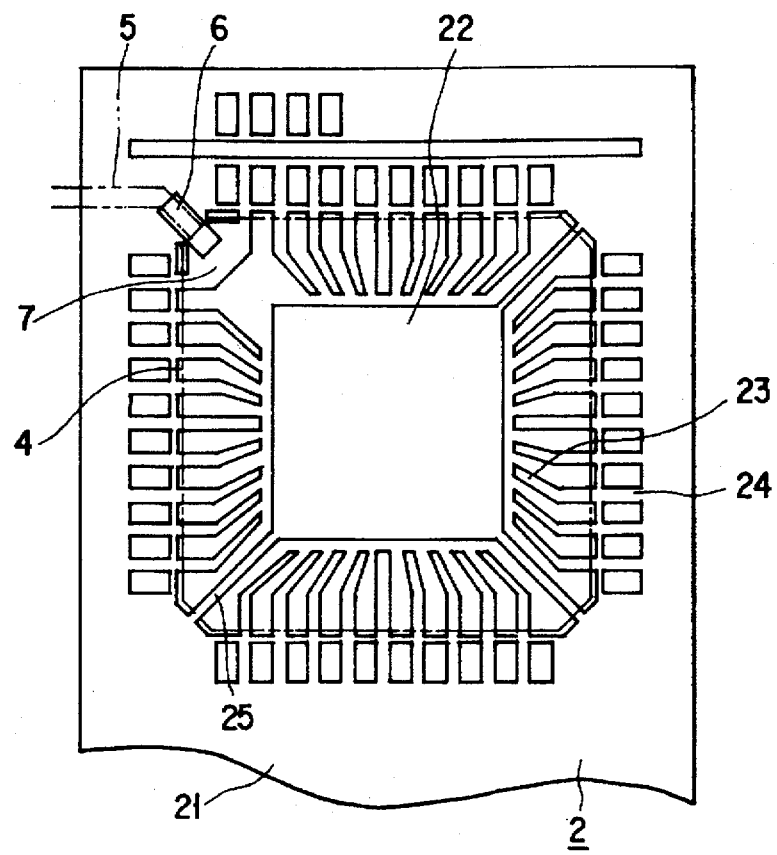
FIG. 18 is a plan view showing still another lead frame of the present invention, for case in a resin-sealed type semiconductor device having substantially square semiconductor chips in which leads are guided from four sides of the chip.

FIG. 18 is a plan view showing other embodiment of the present invention which a resin-sealed type semiconductor device having a square semiconductor chip, in which leads are guided from the four sides of the chip.

This sixth embodiment is the same with the fifth embodiment, except that the shape of the resin flow-control body 7 is different from the shape of the resin flow-control body 7 of the embodiment shown in FIG. 17, and the explanation of other structure will be omitted.

Namely, the shape of the resin flow-control body 7 of the embodiment shown in FIG. 18 is such that a portion of the outer frame 21 which extends toward the die pad 22, is formed integral with the adjacent inner leads 23. The resin flow-control body 7 is therefore broader than in the embodiment shown in FIG. 17. Thereby, the strength of the lead frame 2 is increased.

Other technical effects are similar with that of the fifth embodiment described above.

Next, the seventh embodiment of the lead frame of the present invention will be described with reference to FIG. 19.

Figure 19:
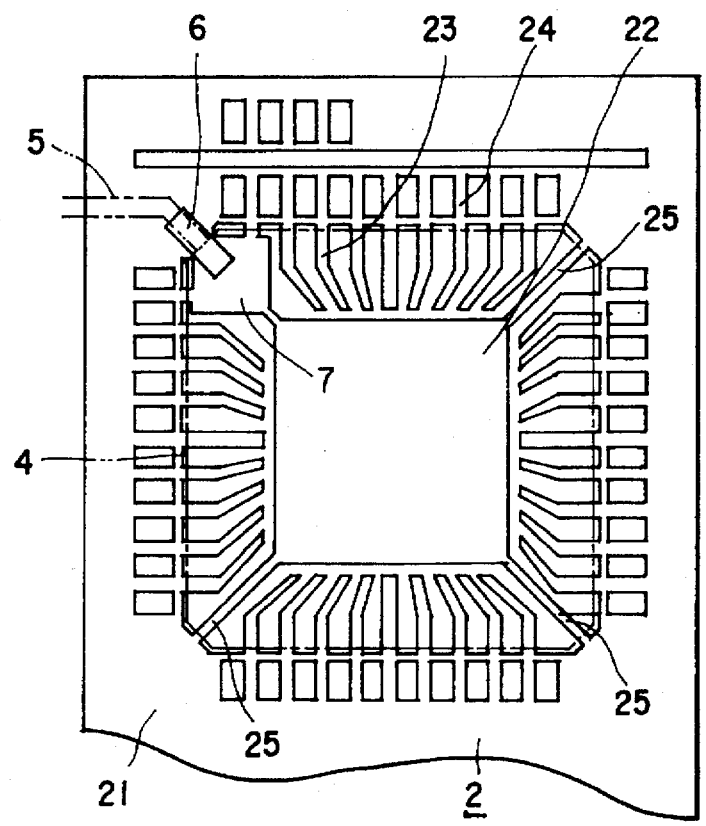
FIG. 19 is a plan view showing other embodiment another lead frame of the present invention, for use in a resin-sealed type semiconductor device having substantially square semiconductor chips in which leads are guided from four sides of the chip.

FIG. 19 is a plan view showing other embodiment of the present invention which is a resin-sealed type semiconductor device having a square semiconductor chip, in which leads are guided from the four sides of the chip.

This seventh embodiment is the same with the sixth embodiment, except that the shape of the resin flow-control body 7 is different from the shape of the resin flow-control body 7 of the embodiment shown in FIG. 18, and the explanation of other structure will be omitted.

Namely, the shape of the resin flow-control body 7 of the embodiment shown in FIG. 19 is such that a portion of the outer frame 21 extends toward the die pad 22 is formed integral with the adjacent inner leads 23. The tip of the extended portion is coupled with the die pad 22.

Therefore, the strength of the lead frame 2 is increased compared to that of FIG. 18.

Other technical effects are similar with that of the fifth embodiment described above.

Next, the eighth embodiment of the lead frame of the present invention will be described with reference to FIG. 20.

FIG. 20 is a plan view showing other embodiment of the present invention which is a resin-sealed type semiconductor device having a square semiconductor chips, in which leads are guided from the four sides of the chip and the lead frame has no die pad.

This eighth embodiment is identical in shape to the sixth embodiment, except that the semiconductor chip 1 is connected directly to the inner leads 23 by bonding wires 3 and that no hanger pin is used at three corners of the lead frame 2. The other structural features will not be described.

Next, the ninth embodiment of the lead frame of the present invention will be described with reference to FIG. 21 and FIG. 22.

FIG. 21 is a plan view showing other embodiment which does not have a die pad of the lead frame of the present invention.

FIG. 22 is a sectional view of the resin-sealed type semiconductor device of the present invention including a lead frame shown in section along the line XXII—XXII in FIG. 21, when the semiconductor chip shown in FIG. 21 is resin-sealed.

Also in this embodiment, there is no die pad portion to which the semiconductor chip 1 is mounted, in the lead frame 2, and the structure of this embodiment is the same with that of the embodiment of FIG. 20, except that the semiconductor chip 1 per se is coupled with and supported by the lead frame 21 by supporting bodies 27, respectively, at four corners, and one corner thereof is coupled with the resin flow-control body 7 formed by extending the outer frame of the lead frame in the direction of the die pad via the supporting body 27, and the explanation of the structure will be omitted.

In addition, it is a matter of course that also in the embodiments shown in FIG. 17 to FIG. 21, the shape of the resin flow-control body can be formed in the shape shown in FIG. 9 to FIG. 14 and FIG. 23 to FIG. 30.

Next, the flow action of the resin at the time of resin sealing will be described with reference to FIG. 23.

Figure 23:
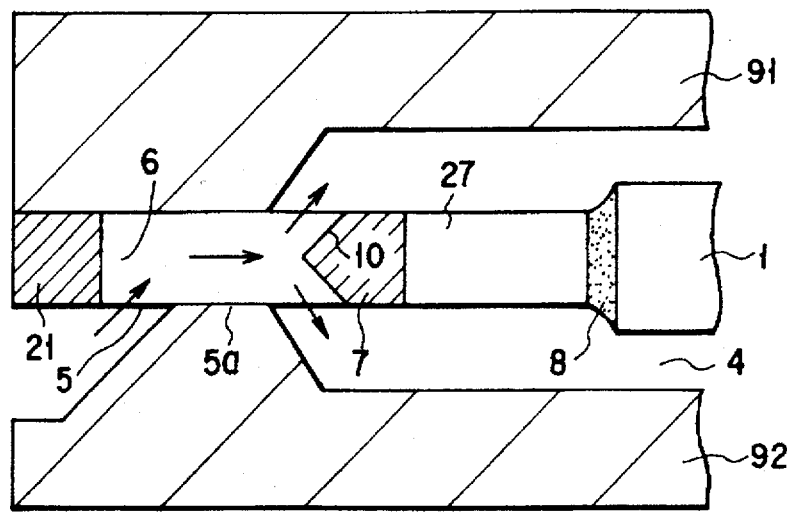
FIG. 23 is a partially sectional view showing a first embodiment of the boundary portion between the gate and the cavity, and illustrating the lead frame of the present invention mounted on the mold.

FIG. 23 is a partially sectional view showing the first concrete structural embodiment of the boundary portion between the gate 5 and the cavity 4, when the lead frame 2 of the present invention is mounted to the mold 9 for forming the resin sealing body.

The structure that the resin flow-control body 7 and the semiconductor chip 1 are supported via the supporting bodies 27 assumes the structure of the ninth embodiment of the above FIG. 21.

The cavity 4 and the gate 5 of the resin-sealing type mold 9 are formed between the opposing faces of the upper mold 91 and the lower mold 92.

In the cavity 4, a portion of the lead frame 2 which is resin-sealed is located, and the fluidized resin is supplied through the gate 5 into the cavity 4.

The space 6 of the outer frame 21 is arranged on the boundary portion of the cavity 4 and the gate 5. This space 6 cooperates with the resin flow-control body 7 to facilitate the flow of the resin. The semiconductor chip 1 is fixed to the semiconductor chip-supporting bodies 27 formed internal with and extending from the resin flow-control body 7 of the lead frame, by adhesive 8 such as an epoxy resin.

The semiconductor chip 1 is located at a midpoint between the top and bottom of the cavity 4. Therefore, the resin supplied from the pot to said mold is fluidized, and the resin supplied to the gate 5 is supplied to the cavity 4 uniformly by the resin flow-control body 7.

In this embodiment, the side face 10 opposite to the outer frame 21 of the resin flow-control body 7, against which the resin flowing from the gate 5 abuts is made to be two faces having such an angle that the resin is diverged to flow, so that the flowing resin can be easily divided uniformly in the upper and lower directions. Therefore, the resin from the gate 5 is divided uniformly in two directions shown by an arrow and covers uniformly the periphery of the semiconductor chip 1.

If the tilt angle of the side face 10 to be processed is made equal to or larger than the tilt angle of the side face of the cavity 4, the injection into the cavity 4 is made easier.

Figure 24:
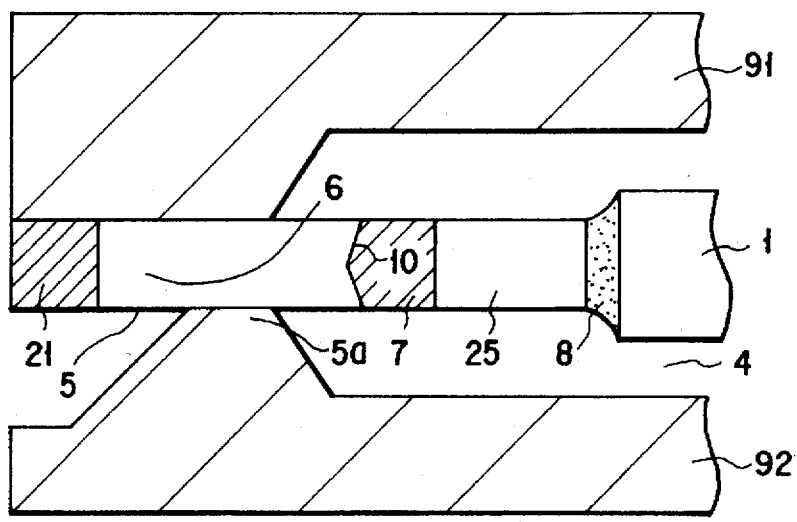
FIG. 24 is a partially sectional view showing a second embodiment of the boundary portion between the gate and the cavity, and showing the lead frame of the present invention mounted on the mold.

FIG. 24 is a partially sectional view showing the second concrete structural embodiment of the boundary portion between the gate 5 and the cavity 4, when the lead frame 2 of the present invention is mounted to the mold 9 for forming the resin sealing body.

The side face 10 opposite to the outer frame 21 of the resin flow-control body 7, against which the resin flowing from the gate 5 abuts is made to be two faces having a slight angle such that the resin is diverged to flow, so that the fluidized resin can be easily divided uniformly in the upper and lower directions. Though the flowability of the resin becomes easy when the angle is large, however, in this embodiment, when the resin flow-control body 7 is a resin having a high viscosity, the strength becomes high, and a large angle is not required.

Also in this structure, the resin from the gate 5 diverges uniformly into two directions, and the resin is covered uniformly on the periphery of the semiconductor chip 1.

Figure 25:
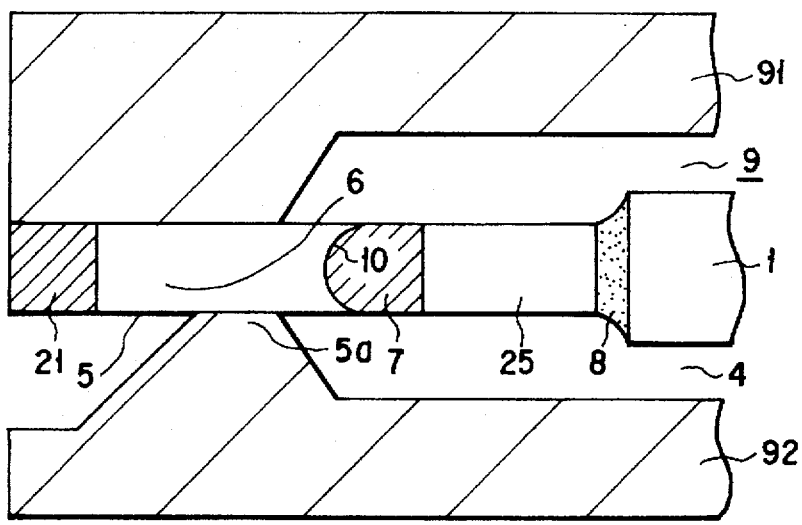
FIG. 25 is a partially sectional view showing a third embodiment of the boundary portion between the gate and the cavity, and illustrating the lead frame of the present invention mounted on the mold.

FIG. 25 is a partially sectional view showing the third concrete structural embodiment of the boundary portion between the gate 5 and the cavity 4, when the lead frame 2 of the present invention is mounted to the mold 9 for forming the resin sealing body.

The side face 10 opposite to the outer frame 21 of the resin flow-control body 7 is processed to be semicircular so that the flowing resin is uniformly diverged to flow, in order to divide easily the fluidized resin uniformly in the upper and lower directions. By such a structure, the flowability of the resin becomes higher. The resin from the gate 5 diverges uniformly into two directions and the resin is covered uniformly on the periphery of the semiconductor chip 1.

Figure 26:
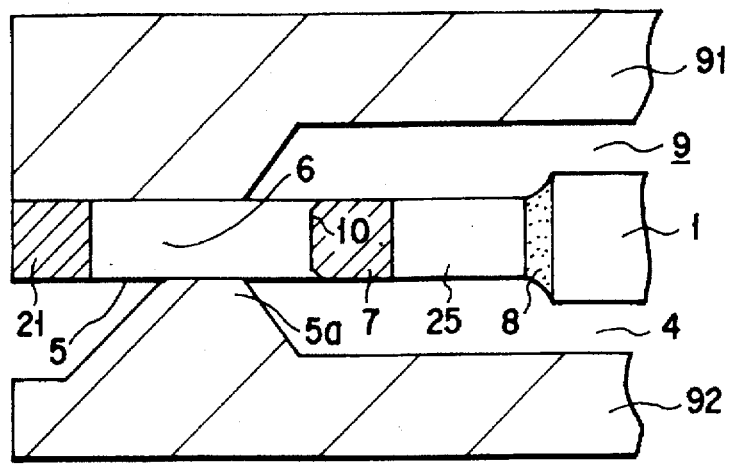
FIG. 26 is a partially sectional view showing a fourth embodiment of the boundary portion between the gate and the cavity, and illustrating the lead frame of the present invention mounted on the mold.

FIG. 26 is a partially sectional view showing the fourth concrete structural embodiment of the boundary portion between the gate 5 and the cavity 4, when the lead frame 2 of the present invention is mounted to the mold 9 for forming the resin sealing body.

It has such a shape that the side face 10 opposite to the outer frame 21 of the resin flow-control body 7, that is, the upper and the lower corners of the side face against which the resin flowing from the gate 5 is cut, in order to divide the fluidized resin easily and uniformly in the upper and the lower directions.

By such a simple structure, the flowability of the resin can be improved. The resin from the gate 5 diverges uniformly into two directions and the resin is covered uniformly on the periphery of the semiconductor chip 1.

Figure 27:
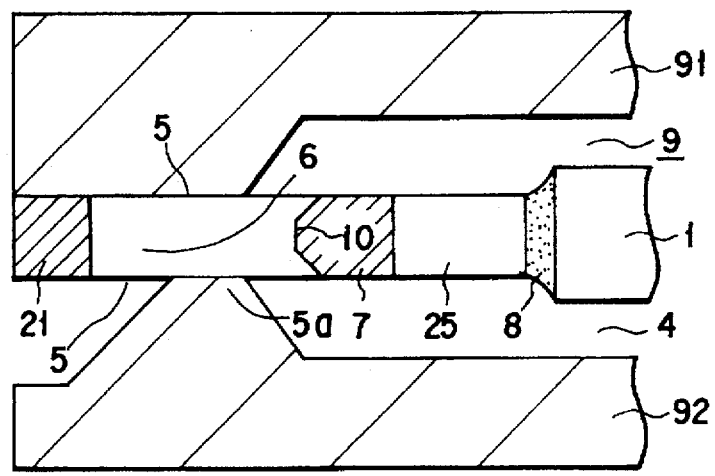
FIG. 27 is a partially sectional view showing a fifth embodiment of the boundary portion between the gate and the cavity, and showing the lead frame of the present invention mounted on the mold.

FIG. 27 is a partially sectional view showing the fifth concrete structural embodiment of the boundary portion between the gate 5 and the cavity 4, when the lead frame 2 of the present invention is mounted to the mold 9 for forming the resin sealing body.

This structure has such a shape that the side face 10 opposite to the outer frame 21 of the resin flow-control body 7, that is, the upper and the lower corners of the side face against which the resin flowing from the gate 5 is cut deeper than the case of the fourth structural embodiment shown in FIG. 26, in order to divide the fluidized resin easily and uniformly in the upper and the lower directions.

That portion of the resin flow-control body 7 which includes the side 10 has a trapezoidal section which is taken along the axis of the body 7. By such a simple structure, the flowability of the resin can be improved. The resin from the gate 5 diverges uniformly into two directions, and the resin is covered uniformly on the periphery of the semiconductor chip 1.

Figure 28:
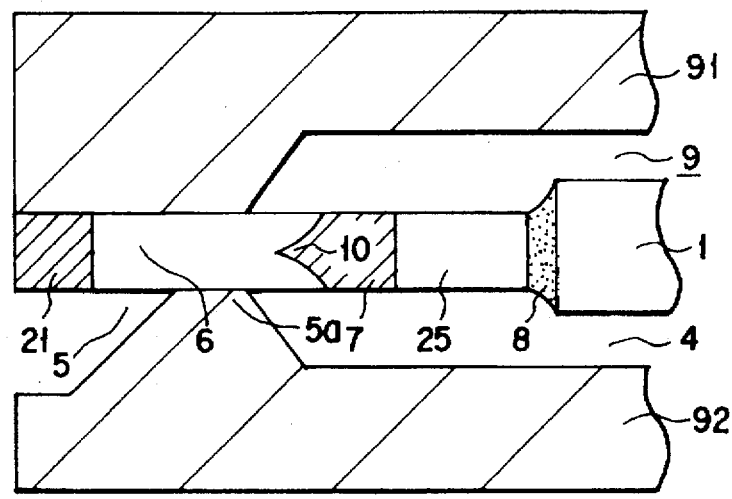
FIG. 28 is a partially sectional view showing a sixth embodiment of the boundary portion between the gate and the cavity, and illustrating the lead frame of the present invention mounted to the mold.

FIG. 28 is a partially sectional view showing the sixth concrete structural embodiment of the boundary portion between the gate 5 and the cavity 4, when the lead frame 2 of the present invention is mounted to the mold 9 for forming the resin sealing body.

In this structural embodiment, the upper and lower edges of the side face 10 opposite to the outer frame 21 of the resin flow-control body 7 is subjected to the etching processing to form an acute tip in the central portion of the side face. By such a simple structure, the flowability of the resin can be improved. The resin from the gate 5 diverges uniformly into two directions and the resin is covered uniformly on the periphery of the semiconductor chip 1.

When the resin is injected into the cavity 4, solidified and forming a molding, the semiconductor chip 1 is located at a midpoint between the top and bottom of the molding.

Figure 29:
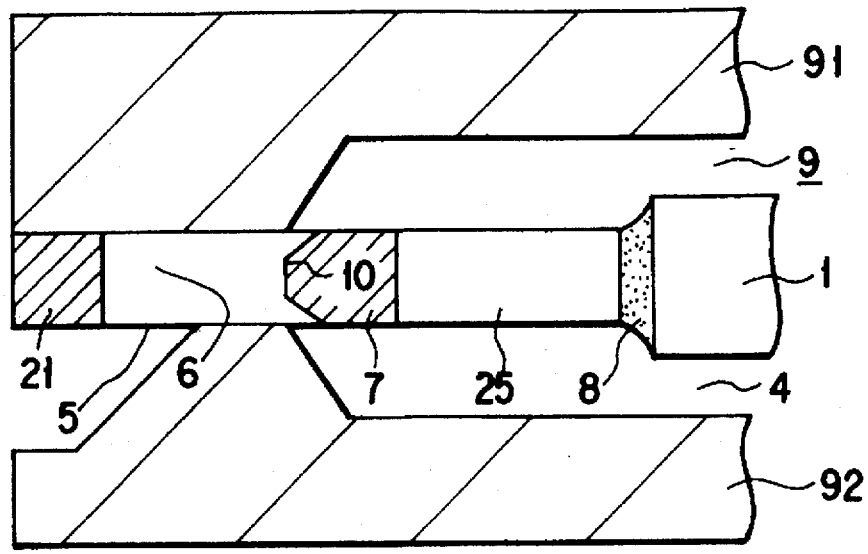
FIG. 29 is a partially sectional view showing a seventh embodiment of the boundary portion between the gate and the cavity, and illustrating the lead frame of the present invention mounted to the mold.

FIG. 29 is a partially sectional view showing the seventh concrete structural embodiment of the boundary portion between the gate 5 and the cavity 4, when the lead frame 2 of the present invention is mounted to the mold 9 for forming the resin sealing body.

In this structural embodiment, the upper and the lower corner of the side face 10 opposite to the outer frame 21 of the resin flow-control body 7 is cut, in order to divide the fluidized resin easily and uniformly in the upper and the lower directions. At this time, that portion of the resin flow-control body 7 which includes the side 10 has a trapezoidal section which is taken along the axis of the body 7.

Furthermore, by putting the side face 10 of this resin flow-control body 7 close to the vicinity of the gate 5, the flow of the resin can be easily moderated.

Therefore, the resin from the gate 5 diverges uniformly into two directions and the resin is covered uniformly on the periphery of the semiconductor chip 1.

Figure 30:
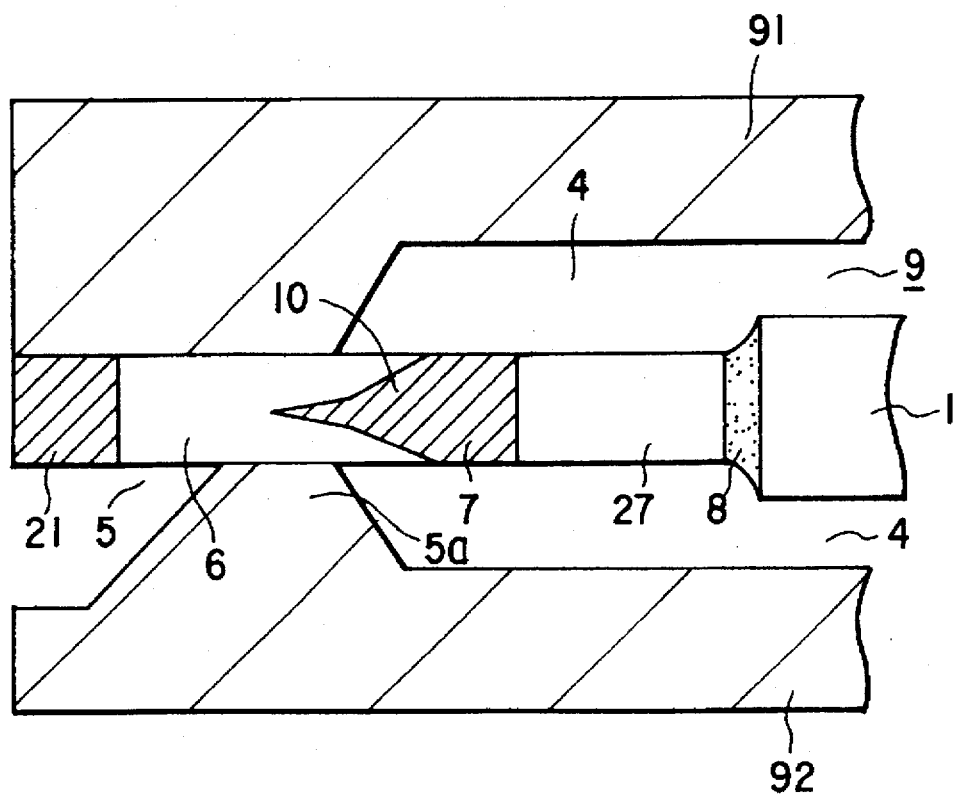
FIG. 30 is a partially sectional view showing an eighth embodiment of the boundary portion between the gate and the cavity, and showing the lead frame of the present invention mounted to the mold.

FIG. 30 is a partially sectional view showing the eighth concrete structural embodiment of the boundary portion between the gate 5 and the cavity 4, when the lead frame 2 of the present invention is mounted to the mold 9 for forming the resin sealing body.

In this structural embodiment, the upper and lower edges of the side face 10 opposite to the outer frame 21 of the resin flow-control body 7 is subjected to the etching processing so that the flowing resin is divided uniformly in the upper and lower directions, to form an acute tip in the central portion of the side face.

This tip is acuter than that of the sixth embodiment shown in FIG. 28, and the tip is arranged so as to be inserted deep in the gate 5, whereby flow of the resin is uniformly divided. As a result, the resin from the gate 5 diverges uniformly into two directions and the resin is covered uniformly on the periphery of the semiconductor chip 1.

As shown in respective embodiments, when the resin is injected into the cavity 4 to form the resin sealing body, the semiconductor chip 1 can be arranged so as to be located in the center in the direction of the thickness of the package. Moreover, the thickness T between the tip of the projection of said projecting body 5a immediately before the resin flows into the cavity 4 of the gate 5, and said mold 91 opposite to the tip has been conventionally around 250 μm, however, in the present invention, the thickness T can be made 150 μm, whereby the present invention is best suited for the thin-type resin-sealed type semiconductor device having a thickness of, for example, from 0.15 to 1 mm, as shown in FIG. 22.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A lead frame for use in a resin-sealed type semiconductor device, comprising:
   an outer frame;
   a plurality of leads supported by said outer frame, arranged side by side and each composed of an inner lead and an outer lead;
   a die pad arranged inside the outer frame and located so that tips of the inner leads are close to the die pad and oppose the die pad; and
   a resin flow-control body having a portion of said outer frame extending toward said die pad through a space formed in said outer frame, the resin flow-control body designed to be placed in a cavity of a mold having a gate communicating with the cavity, and shaped to evenly distribute injected resin to upper and lower portions of the cavity, with said space located between said gate and said cavity, in order to form a resin sealing body.

2. A lead frame according to claim 1, wherein said resin flow-control body defines a part of said space and has a first side onto which resin flowing through said gate is applied and second and third sides which are adjacent to the first side and which oppose each other, said first, second and thrid sides forming two corners each having an angle of about 90°; and said resin flow-control body including the part of said space is substantially rectangular as seen from above the surface of the lead frame.

3. A lead frame according to claim 1, wherein said resin flow-control body defines a part of said space and has a first side onto which resin flowing through said gate is applied and second and third sides which are adjacent to said first side and which oppose each other, said first, second and third sides forming two corners each filled and providing an inclined surface; and said resin flow-control body including the part of said space is substantially rectangular as seen from above the surface of the lead frame.

4. A lead frame according to claim 1, wherein said resin flow-control body defines a part of said space and has an arcuate side onto which resin flowing through said gate is applied perpendicularly; and said resin flow-control body including the part of said space is substantially semicircular as seen from above the surface of the lead frame.

5. A lead frame according to claim 1, wherein said resin flow-control body has two inclined surfaces onto which resin flowing through said gate is applied so as to be divided into two streams.

6. A lead frame according to claim 1, wherein said resin flow-control body has an arcuate surface onto which resin flowing through said gate is applied so as to be divided into two streams.

7. A lead frame according to claim 1, wherein said resin flow-control body has a first surface, a second surface inclined to the first surface and a third surface inclined to the first surface, and resin flowing through said gate is applied onto the first, second and third surfaces.

8. A lead frame according to claim 1, wherein said resin flow-control body has two surfaces onto which resin flowing through said gate is applied and which define an acute angle.

9. A lead frame according to claim 1, wherein said resin flow-control body has a first surface located near said gate, a second surface inclined to the first surface, and a third surface inclined to the first surface, and resin flowing through said gate is applied onto the said first, second and third surfaces.

10. A lead frame according to claim 1, wherein said resin flow-control body has two surfaces onto which resin flowing through said gate is applied, which define an acute angle, and which are located near said gate.

11. A lead frame according to claim 1, wherein said resin flow-control body is connected to said die pad by hanger pins.

12. A lead frame according to claim 1, wherein said die pad is substantially square, and said resin flow-control body is connected to one corner of said die pad by a hanger pin.

13. A lead frame according to claim 1, wherein said resin flow-control body is formed integral with adjacent two of said inner leads.

14. A lead frame according to claim 1, wherein said resin flow-control body is formed integral with one of said inner leads and connected to said die pad.

15. A lead frame for use in a resin-sealed type semiconductor device, comprising:

an outer frame;

a plurality of leads supported by said outer frame, arranged side by side and each composed of an inner lead and an outer lead; and a resin flow-control body having a corner of said outer frame extending toward a corner of a substantially square semiconductor chip, the resin flow-control body designed to be placed in a cavity of a mold having a gate communicating with the cavity, and shaped to evenly distribute injected resin to upper and lower portions of the cavity, with said space located between said gate and said cavity, in order to form a resin sealing body.

16. A lead frame according to claim 15, wherein said resin flow-control body is connected to said semiconductor chip by a support.

17. A lead frame according to claim 15, wherein said resin flow-control body defines a part of said space and has a first side onto which resin flowing through said gate is applied and second and third sides which are adjacent to the first side and which oppose each other, said first, second and third sides forming two corners each having an angle of about 90°; and said resin flow-control body including the part of said space is substantially rectangular as seen from above the surface of the lead frame.

18. A lead frame according to claim 15, wherein said resin flow-control body defines a part of said space and has a first side onto which resin flowing through said gate is applied and second and third sides which are adjacent to said first side and which oppose each other, said first, second and third sides forming two corners each filled and providing an inclined surface; and said resin flow-control body including the part of said space is substantially rectangular as seen from above the surface of the lead frame.

19. A lead frame according to claim 15, wherein said resin flow-control body defines a part of said space and has an arcuate side onto which resin flowing through said gate is applied perpendicularly; and said resin flow-control body including the part of said space is substantially semicircular as seen from above the surface of the lead frame.

20. A lead frame according to claim 15 wherein said resin flow-control has two inclined surfaces onto which resin flowing through said gate is applied so as to be divided into two streams.

21. A lead frame according to claim 15, wherein said resin flow-control body has an arcuate surface onto which resin flowing through said gate is applied so as to be divided into two streams.

22. A lead frame according to claim 15, wherein said resin flow-control body has a first surface, a second surface inclined to the first surface and a third surface inclined to the first surface, and resin flowing through said gate is applied onto the first, second and third surfaces.

23. A lead frame according to claim 15, wherein said resin flow-control body has two surfaces onto which resin flowing through said gate is applied and which define an acute angle.

24. A lead frame according to claim 15, wherein said resin flow-control body has a first surface located near said gate, a second surface inclined to the first surface, and a third surface inclined to the first surface, and resin flowing through said gate is applied onto the said first, second and third surfaces.

25. A lead frame according to claim 15, wherein said resin flow-control body has two surfaces onto which resin flowing through said gate is applied, which define an acute angle, and which are located near said gate.

26. A lead frame according to claim 15, wherein said resin flow-control body is connected to said semiconductor chip by hanger pins.

27. A lead frame according to claim 15, wherein said semiconductor chip is substantially square, and said resin flow-control body is connected to one corner of said semiconductor chip by a hanger pin.

28. A lead frame according to claim 15, wherein said resin flow-control body is formed integral with adjacent two of said inner leads.

29. A lead frame according to claim 15, wherein said resin flow-control body is formed integral with one of said inner leads and connected to said semiconductor chip.

* * * * *